United States Patent
Hsieh

(10) Patent No.: US 8,456,122 B2
(45) Date of Patent: Jun. 4, 2013

(54) CONTROL CIRCUIT FOR FAN

(75) Inventor: Ming-Chih Hsieh, Tu-Cheng (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 266 days.

(21) Appl. No.: 12/967,012

(22) Filed: Dec. 13, 2010

(65) Prior Publication Data

US 2012/0091937 A1    Apr. 19, 2012

(30) Foreign Application Priority Data

Oct. 18, 2010    (TW) .............................. 99135465 A

(51) Int. Cl.
*G05D 23/00* (2006.01)

(52) U.S. Cl.
USPC ...... 318/471; 318/400.04; 318/801; 318/811; 318/400.28; 318/432

(58) Field of Classification Search
USPC .................. 318/400.04, 400.07, 280, 400.13, 318/599, 746, 747, 801, 811, 400.28, 400.27, 318/727, 766, 139, 400.25, 432
See application file for complete search history.

(56) References Cited

U.S. PATENT DOCUMENTS

| | | | | |
|---|---|---|---|---|
| 5,874,818 A * | 2/1999 | Schuurman | ............... | 318/400.04 |
| 6,135,718 A * | 10/2000 | Yang | ............................... | 417/22 |
| 7,193,388 B1 * | 3/2007 | Skinner et al. | ................ | 318/811 |
| 7,233,125 B2 * | 6/2007 | Ramamoorthy et al. | ..... | 318/801 |
| 7,276,878 B2 * | 10/2007 | Phillips et al. | ................ | 318/811 |
| 7,394,215 B2 * | 7/2008 | Tsai et al. | ...................... | 318/461 |
| 7,579,794 B2 * | 8/2009 | Chang et al. | ............. | 361/679.48 |
| 7,952,310 B2 * | 5/2011 | Hamasaki | ..................... | 318/432 |
| 2009/0256505 A1 * | 10/2009 | Maeda et al. | ............ | 318/400.07 |

* cited by examiner

*Primary Examiner* — Eduardo Colon Santana
*Assistant Examiner* — Jorge Carrasquillo
(74) *Attorney, Agent, or Firm* — Altis Law Group, Inc.

(57) ABSTRACT

A control circuit includes a current sensing circuit, an analog digital converter (ADC), an amplifying circuit, a processor, and a switching circuit. The current sensing circuit senses current supplied to an electronic device by a power supply and outputs a first voltage signal. The amplifying circuit amplifies the first voltage signal output from the current sensing circuit to a second voltage signal. The ADC converts the second voltage signal to a digital signal. The processor outputs pulse width modulation (PWM) signals according to the digital signal. The switching circuit receives the PWM signals to control a fan of the electronic device according to the PWM signals.

5 Claims, 3 Drawing Sheets

CONTROL CIRCUIT FOR FAN

BACKGROUND

1. Technical Field

The present disclosure relates to a control circuit for fans.

2. Description of Related Art

In a conventional computer system, a thermistor is used to sense the temperature inside an enclosure of the computer system. The temperature is transmitted to a central processing unit (CPU), and the CPU outputs pulse width modulation (PWM) signals according to the temperature to control the fan. However, the heat sensor takes time to sense any increase or decrease in temperature of the thermistor.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
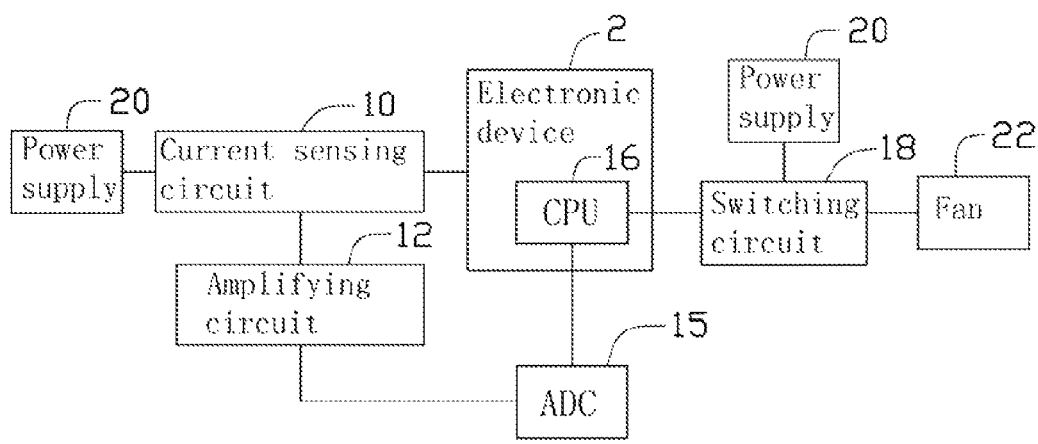
FIG. 1 is a block diagram of a first embodiment of a control circuit for a fan.

Referring to FIG. 1, a first embodiment of a control circuit includes a current sensing circuit 10, an amplifying circuit 12, an analog to digital converter (ADC) 15, a central processing unit (CPU) 16, and a switching circuit 18.

The current sensing circuit 10 is connected between a power supply 20 and an electronic device 2 to sense current supplied to the electronic device 2 by the power supply 20, and output a first voltage signal Vf correspondingly. The amplifying circuit 12 is connected to the current sensing circuit 10 to amplify the first voltage signal Vf output by the current sensing circuit 10 to obtain a second voltage signal Vs. The ADC 15 is connected to the amplifying circuit 12 to convert the second voltage signal Vs to a digital signal and transmit the digital signal to the CPU 16. The CPU 16 outputs pulse width modulation (PWM) signals according to the digital signal to control a fan 22 through the switching circuit 18. In the embodiment, the CPU 16 is a component of the electronic device 2.

Figure 2:
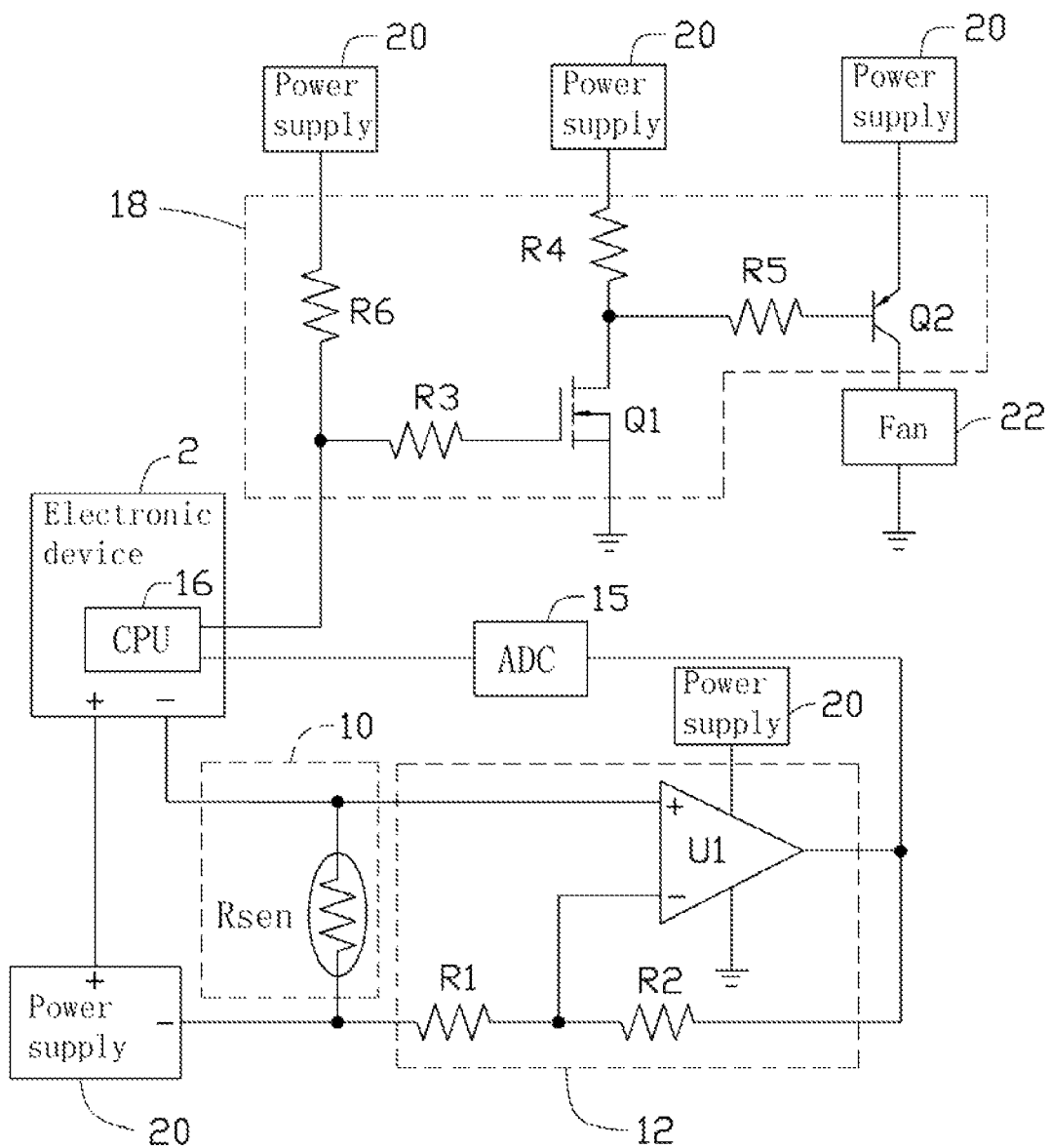
FIG. 2 is a circuit diagram of the control circuit of FIG. 1.

Referring to FIG. 2, the current sensing circuit 10 includes a sense resistor Rsen. A first terminal of the sense resistor Rsen is connected to a negative electrode of the power supply 20. A second terminal of the sense resistor Rsen is connected to the electronic device 2. A positive electrode of the power supply 20 is connected to the electronic device 2. The power supply 20 supplies power to the electronic device 2. The sense resistor Rsen senses current supplied to the electronic device 2 by the power supply 20.

The amplifying circuit 12 includes an amplifier U1, and two resistors R1 and R2. A first terminal of the resistor R1 is connected to the first terminal of the sense resistor Rsen. A second terminal of the resistor R1 is connected to an inverting terminal of the amplifier U1. The inverting terminal of the amplifier U1 is further connected to an output terminal of the amplifier U1 through the resistor R2. The output terminal of the amplifier U1 is further connected to an input terminal of the ADC 15. A non-inverting terminal of the amplifier U1 is connected to the electronic device 2. An output terminal of the ADC 15 is connected to the CPU 16. A power terminal of the amplifier U1 is connected to the power supply 20. A ground terminal of the amplifier U1 is grounded.

The switching circuit 18 includes a field effect transistor (FET) Q1 and a bipolar junction transistor (BJT) transistor Q2. A gate of the FET Q1 is connected to the CPU 16 through a resistor R3. A source of the FET Q1 is grounded. A drain of the FET Q1 is connected to the power supply 20 through a resistor R4. The drain of the FET Q1 is also connected to a base of the BJT transistor Q2 through a resistor R5. An emitter of the BJT transistor Q2 is connected to the power supply 20. A collector of the BJT transistor Q2 is connected to the fan 22. The CPU 16 is further connected to the power supply 20 through a resistor R6.

When the voltage supplied to the electronic device 2 is fixed, the power of the electronic device 2 is equal to the voltage multiplied by the current of the electronic device 2. As a result, when the current sensed by the sense resistor Rsen is high, the power consumed by the electronic device 2 is great, and thus the heat generated by the electronic device 2 will increase and so the fan 22 will be controlled to operate at a higher speed. When the current sensed by the sense resistor Rsen is low, the power consumed by the electronic device 2 is less, and the heat generated by the electronic device 2 is less and the fan 22 will be controlled to operate at a lower speed.

According to the structure of the current sensing circuit 10 and the amplifying circuit 12, the first voltage signal Vf and the second voltage signal Vs may be calculated as follows:

$$Vf=I \times Rsen, \ Vs=Vf \times [1+(R2/R1)]=I \times Rsen \times [1+(R2/R1)].$$

Where, I stands for current flowed through the sense resistor Rsen, Rsen stands for resistance of the sense resistor Rsen, R2 stands for resistance of the resistor R2, and R1 stands for resistance of the resistor R1.

The ADC 15 converts the second voltage signal Vs to the digital signal. The digital signal is transmitted to the CPU 16. The CPU 16 outputs PWM signals according to the digital signal to control the fan 22 by the switching circuit 18.

Designers may obtain a relationship between the digital signal and a duty cycle of the PWM signal in advance. As a result, the CPU 16 adjusts the duty cycle of the PWM signal according to the digital signal, thus controlling the fan 22.

A relationship between the current I flowing through the sense resistor Rsen, the voltage Vs output from the amplifying circuit 12, the digital signal output from the ADC 15, the power P of the electronic device 2, the temperature T of the electronic device 2, the duty cycle of the PWM signal output from the CPU 16, and the rotation speed of the fan 22 is described in table 1.

TABLE 1

| I (mA) | Vs (mV) | ADC | P (mW) | T (°C.) | Duty cycle | Rotation speed (rpm) |
|---|---|---|---|---|---|---|
| I1 | Vs1 = I1 × Rsen × [1 + (R2/R1)] | 000 | V1 × I1 | T1 | 12.5% | r1 |
| I2 | Vs2 = I2 × Rsen × [1 + (R2/R1)] | 001 | V2 × I2 | T2 | 25% | r2 |

TABLE 1-continued

| I (mA) | Vs (mV) | ADC | P (mW) | T (° C.) | Duty cycle | Rotation speed (rpm) |
|---|---|---|---|---|---|---|
| I3 | Vs3 = I3 × Rsen × [1 + (R2/R1)] | 010 | V3 × I3 | T3 | 37.5% | r3 |
| I4 | Vs4 = I4 × Rsen × [1 + (R2/R1)] | 011 | V4 × I4 | T4 | 50% | r4 |
| I5 | Vs5 = I5 × Rsen × [1 + (R2/R1)] | 100 | V5 × I5 | T5 | 62.5% | r5 |
| I6 | Vs6 = I6 × Rsen × [1 + (R2/R1)] | 101 | V6 × I6 | T6 | 75% | r6 |
| I7 | Vs7 = I7 × Rsen × [1 + (R2/R1)] | 110 | V7 × I7 | T7 | 87.5% | r7 |
| I8 | Vs8 = I8 × Rsen × [1 + (R2/R1)] | 111 | V8 × I8 | T8 | 100% | r8 |

From the table 1, we can see that when, for example, the CPU 16 receives a digital signal "100", the duty cycle of the PWM signal output from the CPU 16 is 62.5%. As a result, the rotation speed of the fan 22 is r5 revolutions per minute (rpm). When the CPU 16 receives a digital signal "111", the duty cycle of the PWM signal output from the CPU 16 is 100%. As a result, the rotation speed of the fan 22 is r8 rpm. Thus, speed of the fan 22 is quickly and efficiently adjusted according to the amount of heat generated, which can prolong the life of components while at the same time use power more efficiently.

Figure 3:
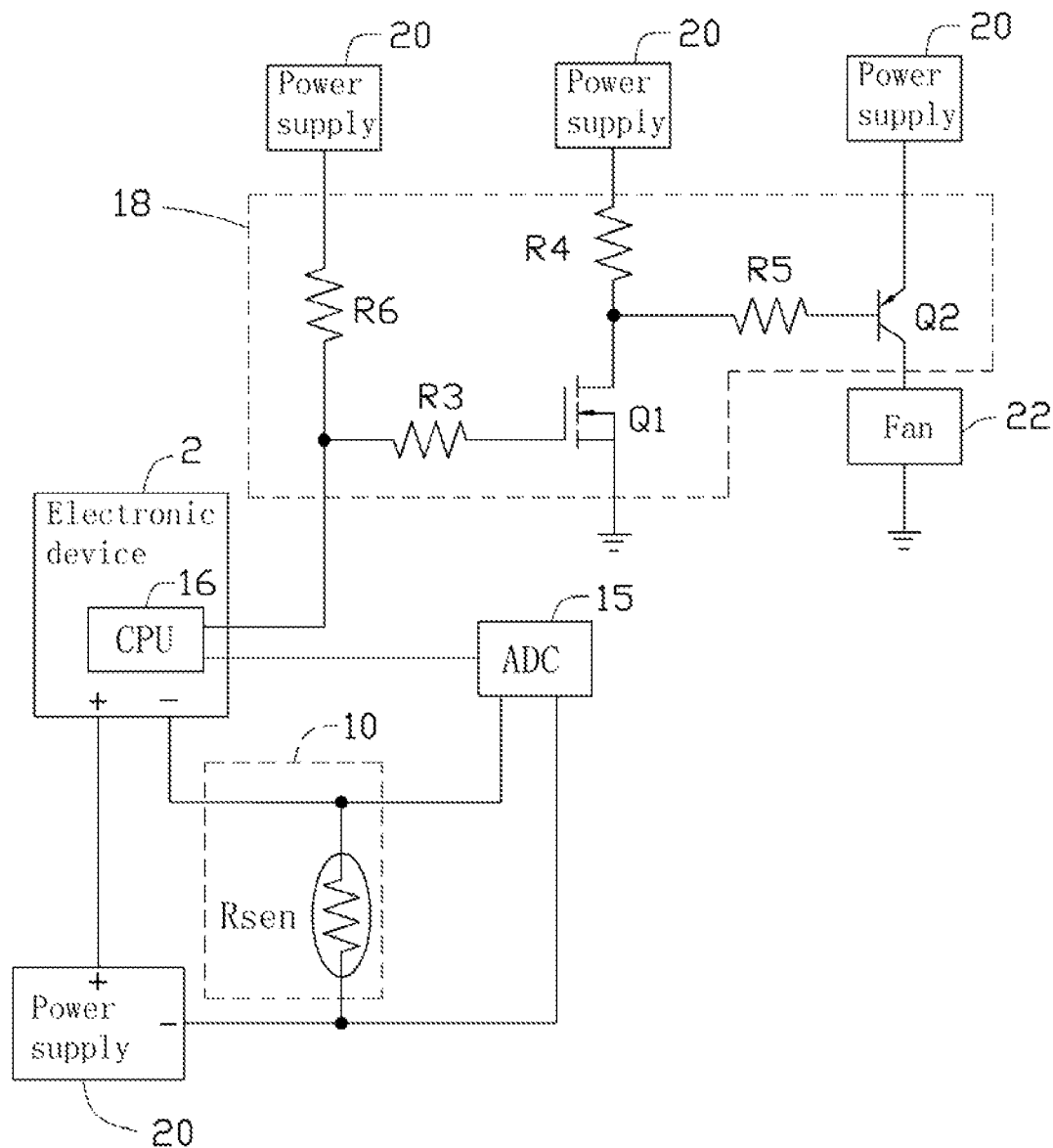
FIG. 3 is a circuit diagram of a second embodiment of a control circuit.

Referring to FIG. 3, compared with the first embodiment of the control circuit, a second embodiment of a control circuit omits the amplifying circuit 12. The two terminals of the sense resistor Rsen in the current sensing circuit 10 are connected to the ADC 15. The ADC 15 converts the first voltage signal Vf output from the current sensing circuit 10 to a digital signal. The CPU 16 outputs pulse width modulation (PWM) signals according to the digital signal to control the fan 22 by the switching circuit 18.

The foregoing description of the embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A control circuit comprising:
a current sensing circuit to sense current supplied for an electronic device by a power supply, and output a first voltage signal;
an amplifying circuit;
an analog to digital converter (ADC), wherein the amplifying circuit is connected between the current sensing circuit and the ADC to amplify the first voltage signal output from the current sensing circuit to a second voltage signal, the ADC converts the second voltage signal to a digital signal;
a processor to output pulse width modulation (PWM) signals according to the digital signal; and
a switching circuit connected between the processor and a fan to control the fan of the electronic device according to the PWM signals; wherein the switching circuit comprises a field effect transistor (FET) and a bipolar junction transistor (BJT) transistor, a gate of the FET is connected to the processor through a first resistor, a source of the FET is grounded, a drain of the FET is connected to the power supply through a second resistor, the drain of the FET is further connected to a base of the BJT transistor through a third resistor, an emitter of the BJT transistor is connected to the power supply, a collector of the BJT transistor is connected to the fan.

2. The control circuit of claim 1, wherein the current sensing circuit comprises a sense resistor.

3. The control circuit of claim 1, wherein the amplifying circuit comprises a first resistor, a second resistor, and an amplifier, a first terminal of the first resistor is connected to a first output terminal of the current sensing circuit, a second terminal of the first resistor is connected to an inverting terminal of the amplifier, the inverting terminal of the amplifier is further connected to an output terminal of the amplifier, a non-inverting terminal of the amplifier is connected to a second output terminal of the current sensing circuit, the output terminal of the amplifier is further connected to the ADC.

4. A control circuit comprising:
a current sensing circuit to sense current supplied for an electronic device by a power supply and output a voltage signal correspondingly;
an analog to digital converter (ADC) to convert the voltage signal to a digital signal;
a processor to output pulse width modulation (PWM) signals according to the digital signal; and
a switching circuit connected between the processor and a fan to control the fan of the electronic device according to the PWM signals; wherein the switching circuit comprises a field effect transistor (FET) and a bipolar junction transistor (BJT) transistor, a gate of the FET is connected to the processor through a first resistor, a source of the FET is grounded, a drain of the FET is connected to the power supply through a second resistor, the drain of the FET is further connected to a base of the BJT transistor through a third resistor, an emitter of the BJT transistor is connected to the power supply, a collector of the BJT transistor is connected to the fan.

5. The control circuit of claim 4, wherein the current sensing circuit comprises a sense resistor.

\* \* \* \* \*